US009312033B2

(12) United States Patent
Ahn

(10) Patent No.: US 9,312,033 B2
(45) Date of Patent: Apr. 12, 2016

(54) NOR-TYPE FLASH MEMORY DEVICE CONFIGURED TO REDUCE PROGRAM MALFUNCTION

(71) Applicant: FIDELIX CO., LTD., Seongnam-si, Gyeonggi-do (KR)

(72) Inventor: Seung Han Ahn, Seongnam-si (KR)

(73) Assignee: FIDELIX CO., LTD., Seongnam-Si, Gyeonggi-Do (KR)

( * ) Notice: Subject to any disclaimer, the term of this patent is extended or adjusted under 35 U.S.C. 154(b) by 191 days.

(21) Appl. No.: 14/041,992

(22) Filed: Sep. 30, 2013

(65) Prior Publication Data

US 2015/0039807 A1    Feb. 5, 2015

(30) Foreign Application Priority Data

Jul. 30, 2013    (KR) .......................... 10-2013-0090249

(51) Int. Cl.
*G11C 16/04* (2006.01)
*G11C 29/00* (2006.01)
*G11C 16/24* (2006.01)
*G11C 16/08* (2006.01)

(52) U.S. Cl.
CPC ................ *G11C 29/82* (2013.01); *G11C 16/24* (2013.01); *G11C 16/08* (2013.01)

(58) Field of Classification Search
CPC .......................... G11C 16/0483; H01L 27/115
USPC ........................................ 365/185.17, 185.25
See application file for complete search history.

(56) References Cited

U.S. PATENT DOCUMENTS

| 2006/0077747 | A1* | 4/2006 | Yano ........................ G11C 7/02 365/230.06 |
| 2011/0170361 | A1* | 7/2011 | Martinelli et al. ....... 365/185.25 |

* cited by examiner

*Primary Examiner* — Huan Hoang
(74) *Attorney, Agent, or Firm* — Kile Park Reed & Houtteman PLLC

(57) ABSTRACT

Embodiments of the present invention include a NOR-type flash memory device capable of reducing or eliminating program malfunctions. In some embodiments, the device includes a memory array, row selection circuit, column selection circuit, and program driver circuit. The memory array includes a memory sector having a first sector bit line and a second sector bit line. The memory array also includes a plurality of flash memory cells disposed on a matrix structure having a plurality of cell bit lines and a plurality of word lines arranged sequentially. The cell bit lines are alternately defined as first cell bit lines and second cell bit lines in sequential order. The first cell bit lines are connected to the first sector bit line in response to column selection signals thereof, and the second cell bit lines are connected to the second sector bit line in response to column selection signals thereof.

3 Claims, 5 Drawing Sheets

NOR-TYPE FLASH MEMORY DEVICE CONFIGURED TO REDUCE PROGRAM MALFUNCTION

CROSS-REFERENCE TO RELATED APPLICATION

This application claims priority to and the benefit of Korean Patent Application No. 10-2013-0090249, filed on Jul. 30, 2013, the disclosure of which is incorporated herein by reference in its entirety.

BACKGROUND

1. Field

Embodiments of the present invention relate to a NOR-type flash memory device, and more particularly, to a NOR-type flash memory device capable of reducing or eliminating program malfunctions.

2. Discussion of Related Art

A flash memory device having a bulk-erase function may have a stack-type gate structure in which a floating gate and a control gate are stacked. A flash memory device having flash memory cells has widely been used for portable electronic devices (e.g., laptop computers, personal digital assistants (PDAs), or cellular phones), computer basic input/output systems (computer BIOSs), and printers.

In circuital aspects, flash memory devices may be classified into NAND-type flash memory devices and NOR-type flash memory devices. A NOR-type flash memory device is advantageous for high-speed operations because respective flash memory cells are connected in parallel between a cell bit line and a ground voltage.

FIG. 1 is a diagram of a portion of a conventional NOR-type flash memory device, which illustrates a portion of a memory array MARR in which flash memory cells are disposed, and circuits related to the portion of the memory array MARR. Referring to FIG. 1, the memory array MARR includes a plurality of memory sectors MSEC, each of which includes a plurality of flash memory cells MC arranged on a matrix structure including a plurality of word lines WL and a plurality of cell bit lines CBL. In this case, each of the cell bit lines CBL is connected to a sector bit line TBL (e.g., a first sector bit line TBL<1> or a second sector bit line TBL<2>) through a respective connection switch CNSW. Also, the plurality of sector bit lines TBL are connected to a global bit line GBL through respective global switches GLSW. In this case, a program voltage (of about 5V) may be applied from a sector bit line TBL corresponding to the global bit line GBL to a cell bit line CBL connected to a programmed flash memory cell.

In the NOR-type flash memory device of FIG. 1, voltages of the cell bit lines CBL in a case in which a specific flash memory cell MC<1,2> is programmed will now be examined. A program voltage VPRO of about 5V may be applied to a cell bit line CBL<2> connected to the specific flash memory cell MC<1,2> (i.e., the programmed cell bit line CBL<2>).

However, during the application of a program voltage to the programmed cell bit line CBL<2>, as shown in FIG. 2, adjacent cell bit lines CBL<1> and CBL<3> may be put into a floating state. In this case, during the programming of the flash memory cells, the adjacent cell bit lines CBL<1> and CBL<3>, which are to be put into a program inhibition state, may be boosted to a considerably high voltage due to coupling noise between the cell bit lines CBL<1> and CBL<3> and the programmed cell bit line CBL<2>.

Thus, a conventional NOR-type flash memory device may suffer malfunctions caused by unintentionally programming flash memory cells MC<1,1> and MC<1,3> connected to the adjacent cell bit lines CBL<1> and CBL<3>.

For reference, in FIG. 1, connection switches CNSW may be driven to connect respective bit lines CBL to their corresponding sector bit line TBL in response to signals provided by cell column decoders. Also, global switches GLSW may be driven to connect respective sector bit lines TBL to a global bit line GBL in response to signals provided by a global decoder.

SUMMARY OF SELECTED EMBODIMENTS OF THE INVENTION

Embodiments of the present invention are directed to a NOR-type flash memory device capable of reducing or eliminating program malfunctions.

In some embodiments, the NOR-type flash memory device includes a memory array, a row selection circuit, a column selection circuit, and a program driver circuit. The memory array includes at least one memory sector, where the at least one memory sector includes a first sector bit line and a second sector bit line. The memory array also includes a plurality of flash memory cells disposed on a matrix structure having a plurality of cell bit lines and a plurality of word lines arranged sequentially. The cell bit lines are alternately defined as first cell bit lines and second cell bit lines in sequential order. The row selection circuit is configured to be driven to select a word line in the plurality of word lines corresponding to a row address. The column selection circuit is configured to be driven to select a cell bit line in the plurality of cell bit lines corresponding to a column address. The program driver circuit is configured to be driven to provide a program voltage to the selected cell bit line. The first cell bit lines are connected to the first sector bit line in response to column selection signals thereof, and the second cell bit lines are connected to the second sector bit line in response to column selection signals thereof.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
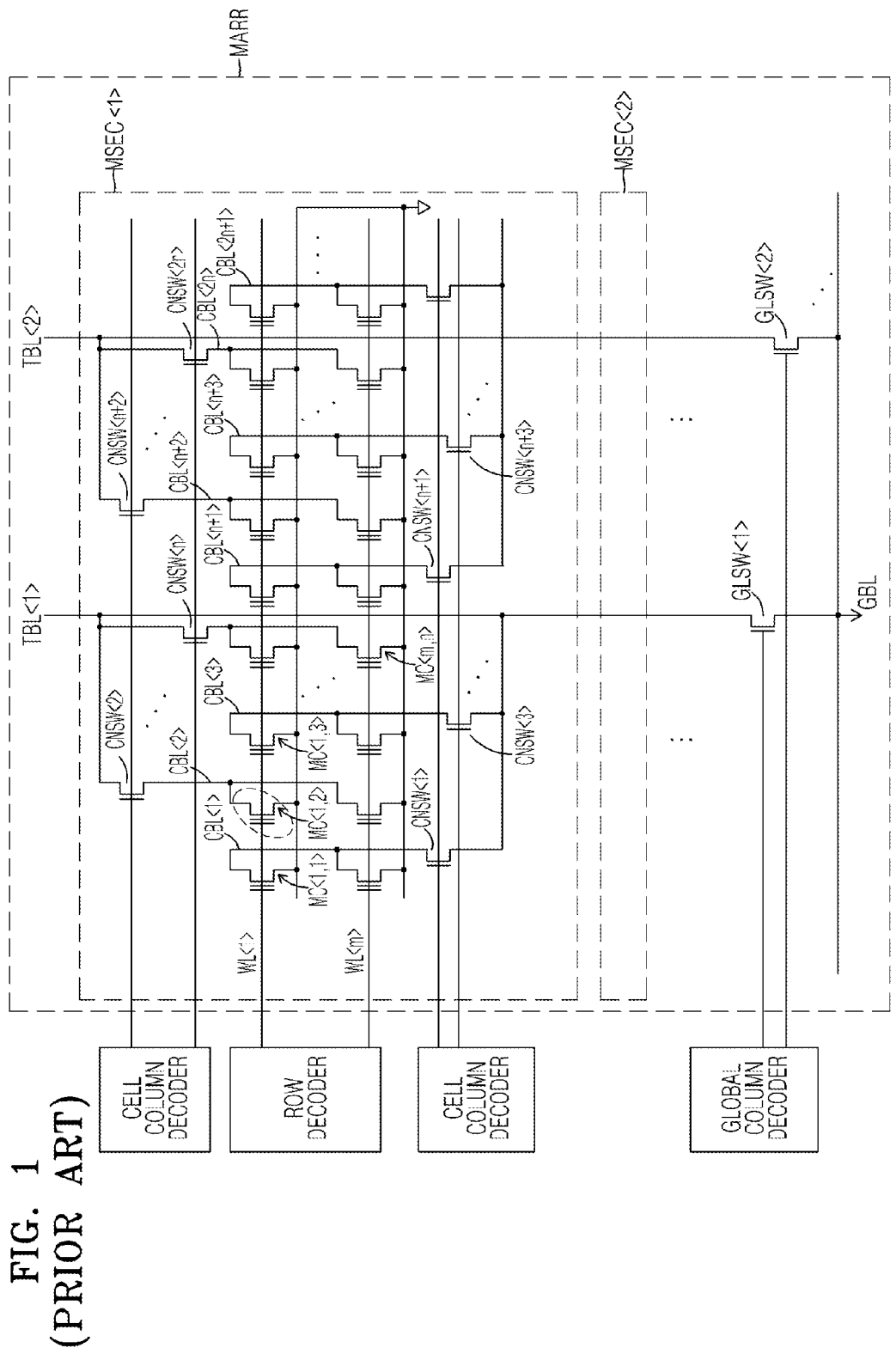
FIG. 1 is a diagram of a portion of a conventional NOR-type flash memory device.
Figure 2:
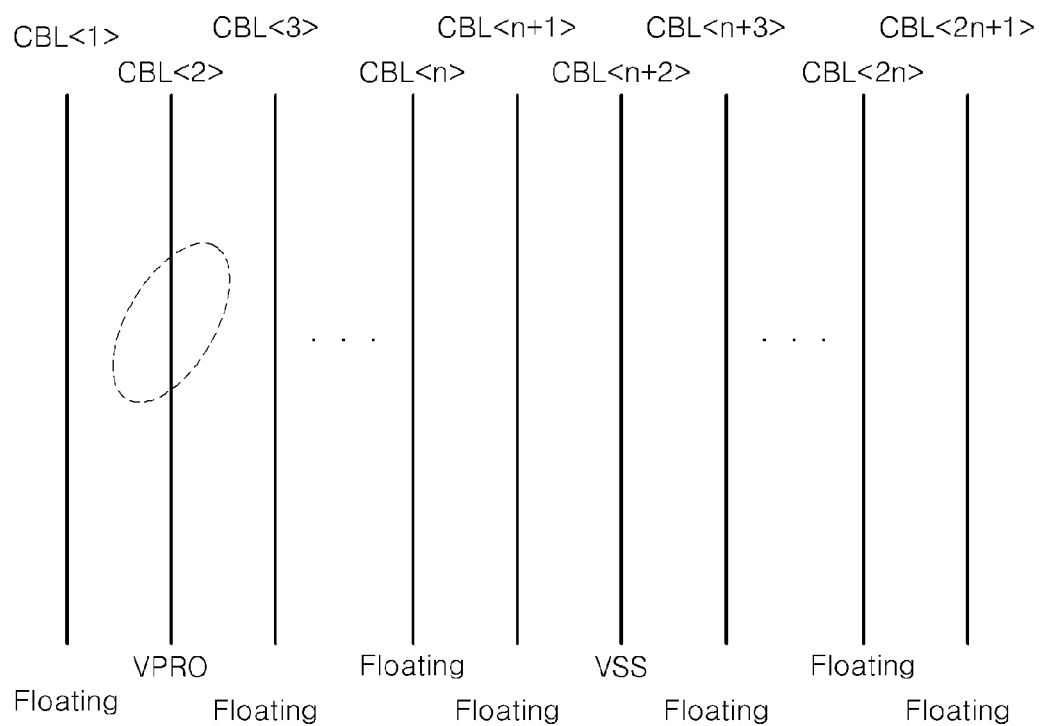
FIG. 2 is a diagram for describing control states of a cell bit line being programmed during a program operation and cell bit lines disposed adjacent to the cell bit line being programmed in the conventional NOR-type flash memory device of FIG. 1.

In the present specification, the same reference numerals and additional reference numerals in parentheses < > are used to denote components having the same constructions and functions. In this case, the components will be inclusively referred to as the same reference numerals. Also, the additional reference numerals in parentheses < > will follow the same reference numerals to separately distinguish the components from one another.

In addition, it should be noted that data lines inclusively referred to as 'bit lines' will be referred to as various terms, such as 'cell bit lines,' 'sector bit lines,' and 'global bit lines,' according to positions thereof.

Embodiments of the present invention will now be described more fully with reference to the accompanying drawings, in which exemplary embodiments of the invention are shown.

Figure 3:
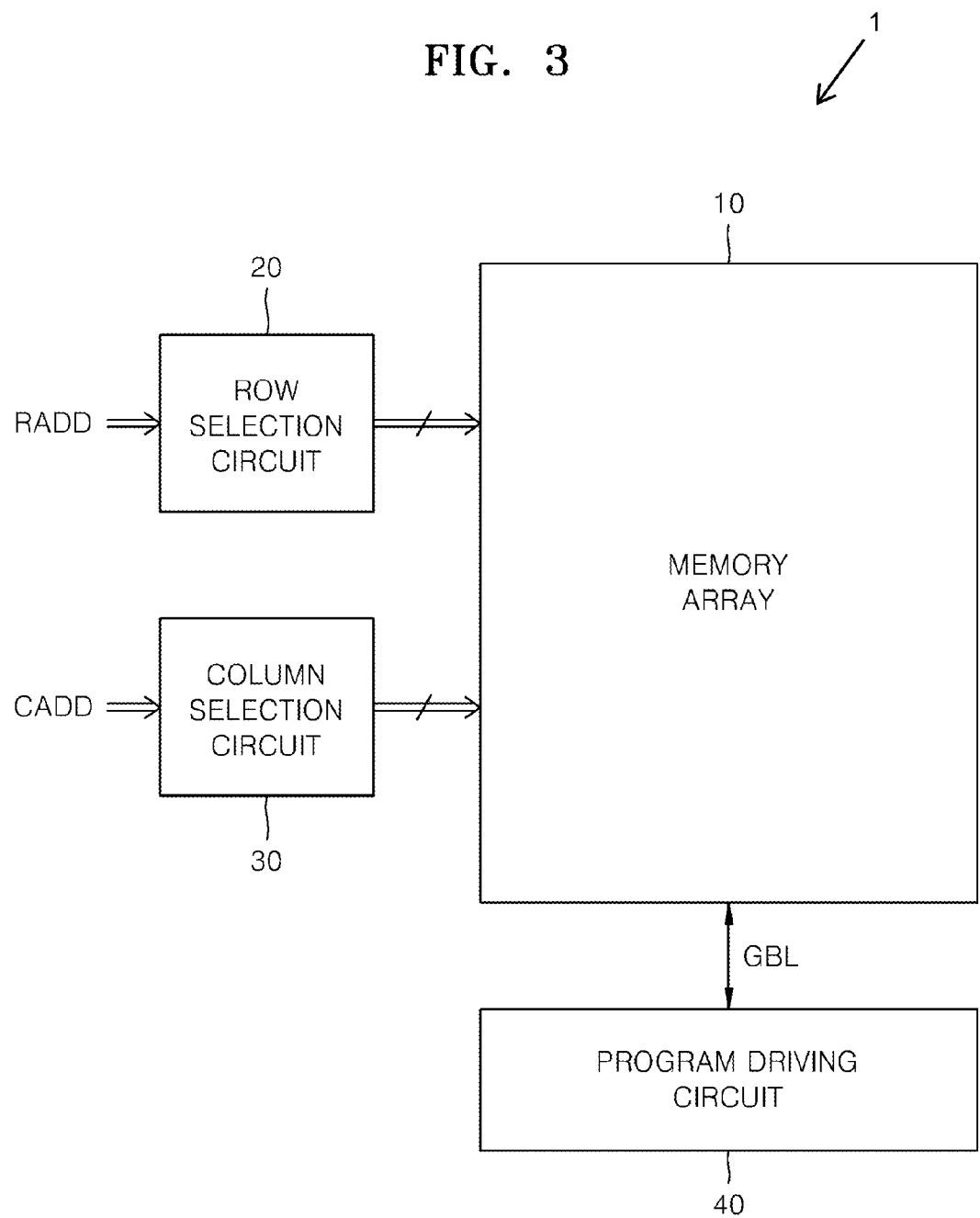
FIG. 3 is a diagram of a NOR-type flash memory device according to an exemplary embodiment of the present invention.
Figure 4:
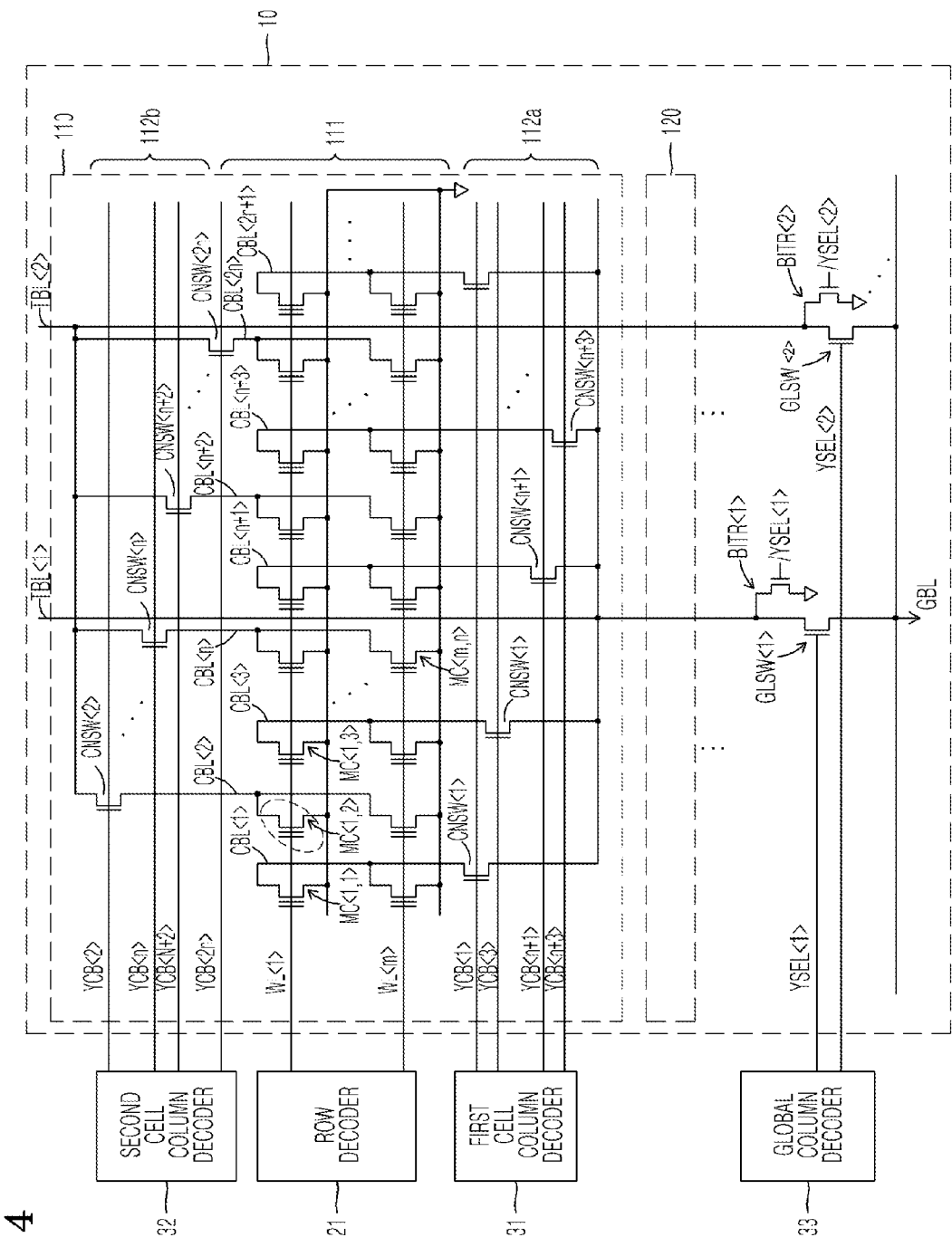
FIG. 4 is a diagram of a portion of a memory array of FIG. 3 and components related to the portion of the memory array.

FIG. 3 is a diagram of a NOR-type flash memory device 1 according to an exemplary embodiment of the present invention, and FIG. 4 is a diagram of a portion of a memory array 10 of FIG. 3 and components related to the portion of the memory array 10. Referring to FIGS. 3 and 4, the NOR-type flash memory device 1 according to the exemplary embodiment of the present invention may include the memory array 10, a row selection circuit 20, a column selection circuit 30, and a program driver circuit 40.

The memory array 10 includes at least one memory sector, such as, for example, a first memory sector 110 and a second memory sector 120, as shown in FIG. 4. In the present specification, only the first memory sector 110 will be chiefly described. Since the remaining memory sectors (e.g., 120) may have the same configuration as the first memory sector 110, a description thereof will be omitted herein.

The memory sector 110 includes a first sector bit line TBL<1> and a second sector bit line TBL<2>. Also, the memory sector 110 includes a plurality of flash memory cells MC disposed on a matrix structure having a plurality of cell bit lines CBL and a plurality of word lines WL arranged sequentially.

The row selection circuit 20 is configured to be driven to select a word line WL in the plurality of word lines WL corresponding to a row address RADD. In some embodiments, the row selection circuit 20 includes a row decoder 21 disposed to correspond to the memory sector 110, and the row decoder 21 is configured to select and activate one of the word lines WL of the corresponding memory sector 110.

The column selection circuit 30 is configured to be driven to select a cell bit line CBL in the plurality of cell bit lines CBL corresponding to a column address CADD. In some embodiments, the column selection circuit 30 includes a first cell column decoder 31, a second cell column decoder 32, and a global column decoder 33 disposed to correspond to the memory sector 110. In such embodiments, the first cell column decoder 31, the second cell column decoder 32, and the global column decoder 33 are configured to be driven to select one of the cell bit lines CBL of the corresponding memory sector 110.

In addition, the program driver circuit 40 is configured to be driven to provide a program voltage VPRO to the selected cell bit line CBL. In some embodiments, the program voltage VPRO is about 5V.

In accordance with some embodiments, the plurality of cell bit lines CBL may be alternately defined as 'first cell bit lines' and 'second cell bit lines' in sequential order. For example, in some embodiments, 2n cell bit lines CBL may form one group. Odd cell bit lines CBL<1>, CBL<3>, ..., CBL<n+1>, CBL<n+3>, ... may be defined as 'first cell bit lines', and even cell bit lines CBL<2>, ..., CBL<n>, CBL<n+2>, ..., and CBL<2n> may be defined as 'second cell bit lines.'

In such embodiments, the first cell bit lines CBL<1>, CBL<3>, ..., CBL<n+1>, CBL<n+3>, ... may be connected to the first sector bit line TBL<1> through first connection switches CNSW<1>, CNSW<3>, ..., CNSW<n+1>, CNSW<n+3>, ..., which may be turned on in response to column selection signals YCB<1>, YCB<3>, ..., YCB<n+1>, YCB<n+3>, ... thereof. Also, the second cell bit lines CBL<2>, ..., CBL<n>, CBL<n+2>, ..., and CBL<2n> may be connected to the second sector bit line TBL<2> through second connection switches CNSW<2>, ..., CNSW<n>, CNSW<n+2>, ..., and CNSW<2n>, which may be turned on in response to column selection signals YCB<2>, ..., YCB<n>, YCB<n+2>, ..., and YCB<2n> thereof.

Also, in some embodiments, as shown in FIG. 4, the memory sector 110 includes a cell region 111, a first connection region 112a, and a second connection region 112b.

The flash memory cells MC may be arranged in the cell region 111. In addition, the first connection switches CNSW<1>, CNSW<3>, ..., CNSW<n+1>, CNSW<n+3>, ... may be arranged in the first connection region 112a, and the second connection switches CNSW<2>, ..., CNSW<n>, CNSW<n+2>, ..., and CNSW<2n> may be arranged in the second connection region 112b.

In some embodiments, the first connection region 112a and the second connection region 112b are disposed opposite each other across the cell region 111. In such embodiments, disposition of the first connection region 112a and the second connection region 112b is facilitated in a layout view.

Also, in some embodiments, the memory array 10 further includes a first global switch GLSW<1> and a second global switch GLSW<2>.

The first global switch GLSW<1> may be driven to connect the first sector bit line TBL<1> to the global bit line GBL in response to a first global selection signal YSEL<1> provided by the global column decoder 33. Also, the second global switch GLSW<2> may be driven to connect the second sector bit line TBL<2> to the global bit line GBL in response to a second global selection signal YSEL<2> provided by the global column decoder 33.

In some embodiments, the first global selection signal YSEL<1> and the second global selection signal YSEL<2> may not be superposed but activated.

Further, in some embodiments, the memory array 10 includes a first bias transistor BITR<1> and a second bias transistor BITR<2>.

The first bias transistor BITR<1> may drive the first sector bit line TBL<1> to a first bias voltage in response to a complementary signal /YSEL<1> of the first global selection signal YSEL<1>. Also, the second bias transistor BITR<2> may drive the second sector bit line TBL<2> to a second bias voltage in response to a complementary signal /YSEL<2> of the second global selection signal YSEL<2>.

In some embodiments, each of the first bias voltage and the second bias voltage is a ground voltage VSS.

Thus, in such embodiments, while each of the first sector bit line TBL<1> and the second sector bit line TBL<2> is not being selected, the corresponding one of the first sector bit line TBL<1> and the second sector bit line TBL<2> may be controlled to have a ground voltage VSS.

Furthermore, in some embodiments, at a program operation, while any one of the first cell bit lines CBL<1>, CBL<3>, ..., CBL<n+1>, CBL<n+3>, ... is being selected and connected to the first sector bit line TBL<1> due to the column address CADD, all the second connection switches CNSW<2>, ..., CNSW<n>, CNSW<n+2>, ..., and CNSW<2n> may be turned on so that all the second cell bit lines CBL<2>, . . . , CBL<n>, CBL<n+2>, . . . , and CBL<2n> can be connected to the second sector bit line TBL<2>.

In addition, in some embodiments, at the program operation, while any one of the second cell bit lines CBL<2>, . . . , CBL<n>, CBL<n+2>, . . . , and CBL<2n> is being selected and connected to the second sector bit line TBL<2> due to the column address CADD, all the first connection switches CNSW<1>, CNSW<3>, . . . , CNSW<n+1>, CNSW<n+3>, . . . may be turned on so that all the first cell bit lines CBL<1>, CBL<3>, . . . , CBL<n+1>, CBL<n+3>, . . . can be connected to the first sector bit line TBL<1>.

In the NOR-type flash memory device having the above-described structure according to some embodiments of the present invention, control states of the cell bit lines CBL at a program operation will be described on assumption that flash memory cells MC<1,2> connected to the cell bit line CBL<2> are programmed.

In this case, the second connection switch CNSW<2> connected to the cell bit line CBL<2> may be turned on. In this case, the remaining second connection switches CNSW<4>, . . . , CNSW<n>, CNSW<n+2>, . . . , and CNSW<2n> may be turned off, and all the first connection switches CNSW<1>, CNSW<3>, . . . , CNSW<n+1>, CNSW<n+3>, . . . may be turned on.

Meanwhile, control states of the first sector bit line TBL<1> and the second sector bit line TBL<2> will now be described.

The second global switch GLSW<2> may be turned on so that a program voltage VPRO can be supplied to the second sector bit line TBL<2>. Also, the first bias transistor BITR<1> may be turned on so that the first sector bit line TBL<1> can be controlled to a ground voltage VSS.

Figure 5:
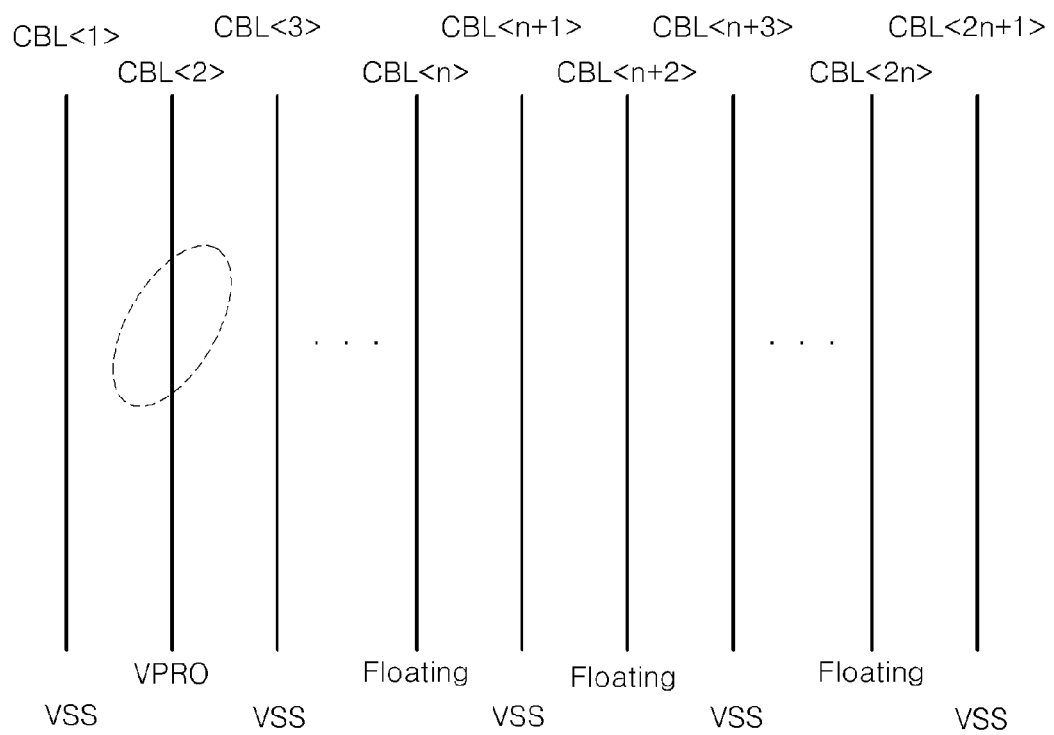
FIG. 5 is a diagram for describing control states of a cell bit line being programmed during a program operation and cell bit lines disposed adjacent to the cell bit line being programmed in the NOR-type flash memory device of FIG. 3.

As a result, in the NOR-type flash memory device according to some embodiments of the present invention, as shown in FIG. 5, while the program voltage VPRO is being provided to one cell bit line CBL<2>, cell bit lines CBL<1> and CBL<3> disposed adjacent to the cell bit line CBL<2> may be controlled not to be in a floating state but to have a ground voltage VSS.

That is, in the NOR-type flash memory device according to some embodiments of the present invention, cell bit lines disposed adjacent to a cell bit line being programmed during a program operation may be controlled by a bias voltage. Thus, in the NOR-type flash memory device according to some embodiments of the present invention, the floating of the cell bit lines disposed adjacent to the programmed cell bit line may be reduced or eliminated, thereby markedly reducing or eliminating program malfunctions.

In a NOR-type flash memory device having the above-described construction, cell bit lines disposed adjacent to a cell bit line being programmed during a program operation can be controlled to have a bias voltage. Thus, in the NOR-type flash memory device according to some embodiments of the present invention, the floating of the cell bit lines disposed adjacent to the programmed cell bit line can be reduced or eliminated, thereby markedly reducing or eliminating program malfunctions.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A NOR-type flash memory device comprising:
    a memory array comprising at least one memory sector, wherein the at least one memory sector comprises a first sector bit line and a second sector bit line, wherein the memory array comprises a plurality of flash memory cells disposed on a matrix structure comprising a plurality of cell bit lines and a plurality of word lines arranged sequentially, and wherein the cell bit lines are alternately defined as first cell bit lines and second cell bit lines in sequential order;
    a row selection circuit configured to be driven to select a word line in the plurality of word lines corresponding to a row address;
    a column selection circuit configured to be driven to select a cell bit line in the plurality of cell bit lines corresponding to a column address; and
    a program driver circuit configured to be driven to provide a program voltage to the selected cell bit line,
    wherein the memory array comprises:
        a first global switch configured to be driven to connect the first sector bit line to a global bit line;
        a second global switch configured to be driven to connect the second sector bit line to the global bit line;
        a first bias transistor configured to drive the first sector bit line to a first bias voltage; and
        a second bias transistor configured to drive the second sector bit line to a second bias voltage,
    the at least one memory sector comprises:
        first connection switches configured to be driven to connect the first cell bit lines to the first sector bit line in response to column selection signals of the first cell bit lines; and
        second connection switches configured to be driven to connect the second cell bit lines to the second sector bit line in response to column selection signals of the first cell bit lines,
    the first connection switches are all turned on during the programming of a flash memory cell connected to any one of the second cell bit lines, and
    the second connection switches are all turned on during the programming of a flash memory cell connected to any one of the first cell bit lines.

2. The device of claim 1, wherein the at least one memory sector further comprises:
    a cell region in which the flash memory cells are arranged;
    a first connection region in which the first connection switches are arranged; and
    a second connection region in which the second connection switches are arranged,
    wherein the first connection region and the second connection region are disposed opposite each other across the cell region.

3. The device of claim 1, wherein each of the first bias voltage and the second bias voltage is a ground voltage.

* * * * *